United States Patent [19]

Colclough

[11] Patent Number: 5,532,592
[45] Date of Patent: Jul. 2, 1996

[54] SQUID CONTROL APPARATUS WITH NON-CRYOGENIC FLUX-LOCKED LOOP DISPOSED IN CLOSE PROXIMITY TO THE SQUID

[75] Inventor: Mark S. Colclough, Sunnyvale, Calif.

[73] Assignee: Conductus, Inc., Sunnyvale, Calif.

[21] Appl. No.: 12,500

[22] Filed: Feb. 2, 1993

[51] Int. Cl.$^6$ .......................... G01R 33/02; G01R 33/035
[52] U.S. Cl. ............................ 324/248; 505/846; 327/527
[58] Field of Search ..................................... 324/244, 248, 324/260, 262; 505/842–846; 327/527

[56] References Cited

U.S. PATENT DOCUMENTS

| | | | |
|---|---|---|---|
| 4,004,217 | 1/1977 | Giffard | 324/248 |
| 4,591,787 | 5/1986 | Hoenig | 324/248 |
| 4,771,239 | 9/1988 | Hoenig | 324/248 |
| 4,793,355 | 12/1988 | Crum et al. | 324/248 X |
| 4,987,367 | 1/1991 | Ishikawa et al. | 324/248 X |
| 4,995,395 | 2/1991 | Ilmoniemi et al. | 324/248 X |
| 5,152,288 | 10/1992 | Hoenig et al. | 324/248 X |
| 5,155,434 | 10/1992 | Fujimaki | 324/248 |
| 5,220,921 | 6/1993 | Ferris et al. | 324/248 X |
| 5,231,353 | 7/1993 | Nakayama et al. | 324/248 |
| 5,285,155 | 2/1994 | Ueda et al. | 324/248 |

FOREIGN PATENT DOCUMENTS

| | | |
|---|---|---|
| 0111826A3 | 6/1984 | European Pat. Off. . |
| 0401420A1 | 12/1990 | European Pat. Off. . |
| 0435651A2 | 7/1991 | European Pat. Off. . |
| 0448368A3 | 9/1991 | European Pat. Off. . |
| 0499968A2 | 8/1992 | European Pat. Off. . |
| A60-061665 | 8/1985 | Japan . |

OTHER PUBLICATIONS

Drung, Dietmar, "DC SQUID systems overview", Superconductor Science and Technology, vol. 4, No. 9 (1991) Sep., No. 9, Bristol, GB.

Flokstra, J., et al., "A 19-channel d.c. SQUID Magnetometer System for Brain Research", Sensors and Actuators, (1991) May, vol. A27, Nos. 1–3, Lausanne, CH, pp. 781–785.

Lekkala, J. O., and J. A. V. Malmivuo, "Multiplexed SQUID vectormagnetometer for biomagnetic research", Journal of Physics E. Scientific Instruments, vol. 17, No. 6, (Jun. 1984), Bristol, GB, pp. 504–512.

Weinstock, Harold, "Introduction to Superconductive Magnetometry and its Applications", Proceedings of the 7th Annual Conference of the IEEE/Engineering in Medicine and Biology Society, vol. 2, Sep. 1985, Chicago, pp. 718–721.

Analog Devices, "Quad 12–Bit Serial Voltage–Output DAC, Preliminary, DAC–8420", Datasheet (Norwood, Mass.: Jun. 23, 1992).

Applied Physics Systems, "Model 581 DC SQUID System" (Mountain View, CA: Jan. 1990).

(List continued on next page.)

Primary Examiner—Sandra L. O'Shea
Assistant Examiner—Jay M. Patidar
Attorney, Agent, or Firm—Fliesler, Dubb, Meyer & Lovejoy

[57] ABSTRACT

SQUID control apparatus for controlling multiple SQUID probes includes a plurality of head units each corresponding to a respective SQUID probe, each of the head units including a non-cryogenic modulated flux-locked loop feedback circuit operating at a respective modulation frequency. The apparatus also includes a base unit coupled to all of the head units, the base unit providing control signals to control the multiple head units. Means are also provided, such as through the use of a daisy chain topology, for synchronizing the modulation frequency of all of the modulated flux-locked loop feedback circuits. The head units may also contain a phase shifter coupled to phase shift the modulation frequency oscillator signal for provision to the local oscillator input of a demodulator, and the phase shifter may include a shifting filter for filtering the oscillator signal to reduce all frequency components except a fundamental frequency component, and for phase shifting the fundamental frequency component by a desired amount, and shaping means for shaping the filtered and shifted signal into a square wave.

26 Claims, 5 Drawing Sheets

OTHER PUBLICATIONS

Clarke, John, "Principles and Applications of SQUIDs", Proceedings of the IEEE, vol. 77, No. 8, 1208–1223 (Aug. 1989).

EG&G Brookdeal Electronics, Princeton Applied Research, "Model 128A Lock–In Amplifier–Operating and Service Manual", (Princeton, New Jersey: Jan. 1971), p. VII–7.

Fujimaki, N., "Josephson Integrated Circuits III—A Single--Chip SQUID Magnetometer", Fujitsu Sci. Tech. J., vol. 27, No. 1 (Apr. 1991), pp. 59–83.

Horowitz, et al. "The Art of Electronics", Second Edition, (Cambridge University Press: Jan. 1990), pp. 77–78.

National Semiconductor Corp., LM311 Voltage Comparator Linear Databook (Jan. 1978), pp. 5–16–5–23.

Quantum Design, "DC SQUID Sensors, Electronics and systems" (Jan. 1990).

Quantum Design, Inc., "Model 5000 DC SQUID Controller Operator's Manual" (Jan. 1991).

Wellstood, et al., "Integrated dc SQUID Magnetometer with a High Slew Rate", Rev. Sci. Instrum., vol. 55, No. 6, pp. 952–957 (Jun. 1984).

5,532,592

SQUID CONTROL APPARATUS WITH NON-CRYOGENIC FLUX-LOCKED LOOP DISPOSED IN CLOSE PROXIMITY TO THE SQUID

BACKGROUND

1. Field of the Invention

The invention relates to apparatus for controlling SQUIDs, and more particularly, apparatus for coordinating and controlling multiple SQUIDs.

2. Description of Related Art

A superconducting quantum interference device (SQUID) is made up of a superconducting loop which is broken in at least one place by a Josephson junction. If the SQUID contains only one junction, then it is known as an RF SQUID since it must be biased with an oscillating current. If the SQUID contains two or more junctions, then it is known as a DC SQUID since it can be biased with a DC current. The present invention relates primarily to the control of DC SQUIDs, but some aspects can also be used in control systems for RF SQUIDs.

In essence, a DC SQUID is a magnetic flux-to-voltage convertor since it provides an output voltage across the junctions which varies as a function of the total magnetic flux applied to the superconducting loop. The output voltage is periodic in the applied flux, with a period of one flux quantum $\Phi_0$. Thus by applying a fixed DC flux to the SQUID to set a quiescent voltage output level, magnetic fields producing flux in the SQUID on the order of a single flux quantum can be detected by measuring the deviation of the SQUID output voltage from the quiescent value.

SQUIDs and their control systems are described in Clarke, "Principles and Applications of SQUIDs", Proceedings of the IEEE, Vol. 77, No. 8, 1208–1223 (1989), incorporated herein by reference. As described therein, most SQUID readout schemes involve the use of a flux-locked loop (FLL) circuit. Whenever the voltage output of the SQUID deviates from a quiescent value (usually zero) due to externally applied flux, the circuit generates a feedback current which is applied to a feedback coil near the SQUID. The circuit provides whatever feedback current is required such that the flux due to the feedback coil compensates for the externally applied flux, thereby canceling out the externally applied flux and returning to zero the net flux applied to the SQUID. The voltage output of the SQUID is thus maintained at the quiescent value. The feedback current level which was needed to cancel the externally applied flux is then monitored to provide an analog output signal indicating the magnitude of the externally applied flux.

It can be seen that not only does this technique permit sensing externally applied flux levels which are significantly smaller than a single flux quantum, but since it continually drives the SQUID back to a predefined operating point on the voltage/flux curve, the technique is not limited by the periodic nature of that curve. Externally applied flux levels of many times $\Phi_0$ can be measured as long as the FLL feedback circuitry can supply the necessary compensating current, and as long as the FLL feedback circuit responds quickly enough to prevent jumps from one period of the curve to the next. The FLL technique also provides an analog output signal which varies linearly with the externally applied flux.

To be practical, an FLL may include an integrator to integrate the deviation of the SQUID voltage output from the quiescent value. Also, any DC drift problems inherent in the FLL circuit can be ameliorated by modulating the feedback current at an RF frequency of approximately 100 kHz–500 kHz and demodulating the voltage output of the SQUID at the same frequency. If the operating point of the SQUID is set at a minimum or maximum of the voltage/flux curve, and the modulation of the feedback current is by a square wave having a magnitude which is sufficient to oscillate the feedback flux supplied to the SQUID by $\pm\Phi_0/4$, then the voltage output of the SQUID will alternate between a point half way up the voltage/flux curve to the left of the oprating point and a point half way up the voltage/flux curve to the right of the operating point. Both voltages are equal, so the AC component of the SQUID output voltage will be zero. A SQUID in such a state is referred to herein as exhibiting an average alternating voltage at a quiescent level of zero. When an external magnetic flux is applied, the operating point will no longer be at a maximum or minimum of the voltage/flux curve. Thus the voltage output of the SQUID will alternate between points to the left and right of the operating point whose voltages are no longer equal, and the average alternating voltage output will therefore deviate above or below the quiescent value of zero. The FLL feedback circuit can compensate for the externally applied flux and thus produce the desired analog output signal. The modulating current may either be added to the feedback current provided to the feedback coil, or it may be delivered separately to a separate modulation coil located near the SQUID. Demodulation is accomplished using a conventional synchronous demodulator or lock-in detector.

As used herein, an "FLL circuit" is considered to include the SQUID itself, an optional preamplifier coupled to the SQUID, the optional lock-in detector and the optional integrator, as well as the current feedback path and the feedback coil. An "FLL feedback circuit" is considered to include the preamplifier, lock-in detector, integrator and current path back to the feedback coil, but not the feedback coil itself nor the SQUID. An FLL circuit or FLL feedback circuit is referred to herein as a modulated FLL circuit or a modulated FLL feedback circuit if the above-described modulation and demodulation technique is used.

In a typical system, the SQUID and the various coils are provided on a SQUID probe which is adapted to be maintained at cryogenic temperatures. The FLL feedback circuit typically operates at room temperature and is coupled to the probe by a probe cable. As used herein, a circuit operates at "cryogenic temperatures" if it takes advantage of superconducting phenomena. Similarly, a circuit operates at "room temperature" if it does not employ superconducting phenomena. It is not intended that a circuit be at exactly the ambient temperature of the outside environment to be considered a "room temperature" circuit. The voltage output of the SQUID may be coupled to the input of the FLL feedback circuit via one or more impedance-matching transformers as well as an optional DC blocking capacitor and/or a resonant circuit. In different designs, different ones of these coupling components are located on the probe and held at cryogenic temperatures, or located with the FLL feedback circuit and held at room temperatures.

In Applied Physics Systems, "Model 581 DC SQUID System" (Mountain View, Calif.: 1990), there is described a SQUID system which includes a DC SQUID sensor, a cryogenic probe (which, together with the DC SQUID sensor would constitute a "SQUID probe" as the term is used herein), SQUID processor electronics, and a control/display console. The cryogenic probe comprises a rod for insertion into a cryostat, and the SQUID sensor is attached to the insertion end of the tube. A brass enclosure containing RFI filters and a connector is attached to the non-inserted end of the tube. The SQUID processor electronics component is a highly shielded and filtered enclosure which contains all of the SQUID closed-loop electronics. It is coupled to the connector at the end of the SQUID probe via a short shielded cable. The SQUID processor electronics component is too large to mount easily on top of the cryostat, and certainly too large for more than two or three to be accommodated on top of the cryostat.

The Applied Physics Systems (APS) SQUID is adequate where only a single SQUID is to be inserted into the cryostat. Applications for SQUIDs are developing, however, which require a plurality of SQUIDs in operation simultaneously. For example, a SQUID system used for sensing brain wave-generated flux signals may require several SQUID sensors each disposed within one inch from another. For these types of applications, the APS technique would not be adequate for at least two reasons. First, each channel would require its own complete set of components including its own SQUID probe, its own processor electronics component, and its own control/display console. The console outputs might also be connected to a data acquisition module of a single computer, but no provisions are made for the computer to control the operation of the SQUIDs; each console would have to be adjusted by hand.

Second, in addition to the large number of components, the APS system contains no provisions to synchronize the modulation frequencies of the various channels. Since the SQUIDs are likely to be located within close proximity to each other, the feedback flux applied to one SQUID will likely be sensed in part by another SQUID. Any differences in the modulation frequencies between SQUIDs are likely to cause undesirable beats in the readings from the various SQUIDs.

In Quantum Design, "DC SQUID Sensors, Electronics and Systems" (1990), there is described a system specifically intended for multiple-channel use. The system comprises a SQUID controller which contains one "masterboard" and, for each channel, a separate "multicard". The input/output structure for each channel includes a flexible SQUID probe/sensor for insertion into a cryostat, a flexible cable for coupling the probe to room temperature electronics, a small back shell-style micropreamp, and up to ten meters of highly shielded cable for coupling the micropreamp to the respective multicard. The micropreamp contains its own RF shielding and filtering, and the DC SQUID probe and cable contains its own RF immunity and magnetic shielding. The micropreamp works with either internal or external feedback and the SQUID probe is wired for either type of application.

The Quantum Design (QD) system implements a separate flux-locked loop arrangement for each channel, but the major portion of the FLL feedback circuitry is located in the multicard, up to ten meters distant from the SQUID. Specifically, the voltage output of the SQUID is first amplified to some extent by the micropreamp, then transmitted differentially over the heavily shielded cable to the multicard. The multicard contains the lock-in detector, integrator and feedback current path. The RF modulation frequency is applied to the feedback current path (or to a separate modulation current lead) on the multicard and transmitted through the cable to the SQUID probe. Similarly, the signal output of the micropreamp still contains the RF modulation frequency, which is not removed until the signal reaches the lock-in detector on the multicard. The transmission of RF signals through the cable limits the maximum length of the cable between the SQUID probe and the controller and reinforces the requirement that the cable be heavily shielded and that signals be transmitted differentially.

In addition, each of the multicards in the QD system also contains various channel-specific digital circuits such as D/A converters for controlling the SQUID bias current, skew current and DC offset current. They also contain digitally controlled analog switches for controlling such adjustments as the gain of the FLL and the choice of an anti-aliasing filter. Accordingly, noise from the switching of these circuits could deleteriously affect the operation of the flux locked loop. Moreover, the master board, which also contains such digital circuits as multiplexers, A/D converters, a FIFO and a microprocessor, is disposed in the same SQUID controller box as all of the multicards. Noise from these components, too, are likely to affect the operation of the flux locked loops. The QD system requires extensive internal shielding to minimize these effects, and even this shielding is imperfect due to the hardware connections that must penetrate in order to control the FLL.

The controller unit of the QD system is adapted to be controlled either from a front panel or from an external computer which is coupled to the controller via an RS232 or GPIB port. Output signals read from the probes are displayed on the front panel of the controller and/or transmitted to the external computer. The commands for controlling the SQUID controller in the QD system are described in Quantum Design, Inc., "Model 5000 DC SQUID Controller Operator's Manual" (1991), incorporated herein by reference.

In Fujimaki, "Josephson Integrated Circuits III—A Single-Chip SQUID Magnetometer", Fujitsu Sci. Tech. J., Vol 27, No. 1 (1991), pp. 59–83, there is described a multiple SQUID system in which each SQUID channel includes a digital feedback loop constructed using Josephson digital circuits on the same cryogenic chip as the SQUID. However, significant additional work is required before a system using this technique will become practical.

Yet another technique for controlling SQUIDs involves the inclusion of the SQUID in a relaxation oscillator. This technique is probably not useful for controlling multiple, closely spaced SQUIDs, however, since the SQUIDs by definition will operate at different frequencies.

Accordingly, it is an object of the present invention to provide a SQUID control system which ameliorates some or all of the above-mentioned problems.

SUMMARY OF THE INVENTION

According to the invention, roughly described, SQUID control apparatus for controlling multiple SQUID probes includes a plurality of head units each corresponding to a respective SQUID probe, each of the head units including a non-cryogenic modulated flux-locked loop feedback circuit operating at a respective modulation frequency. The apparatus also includes a base unit coupled to all of the head units, the base unit providing control signals to control the multiple head units. Means are also provided, such as through the use of a daisy chain topology, for synchronizing the modulation frequency of all of the modulated flux-locked loop feedback circuits. The head units may also contain a phase shifter coupled to phase shift the modulation frequency oscillator signal for provision to the local oscillator input of a demodulator, and the phase shifter may include a shifting filter for filtering the oscillator signal to reduce all frequency components except a fundamental frequency component, and for phase shifting the fundamental frequency component by a desired amount, and shaping means for shaping the filtered and shifted signal into a square wave.

BRIEF DESCRIPTION OF THE DRAWINGS

The invention will be described with respect to particular embodiments thereof, and reference will be made to the drawings, in which.

DETAILED DESCRIPTION

Figure 1:
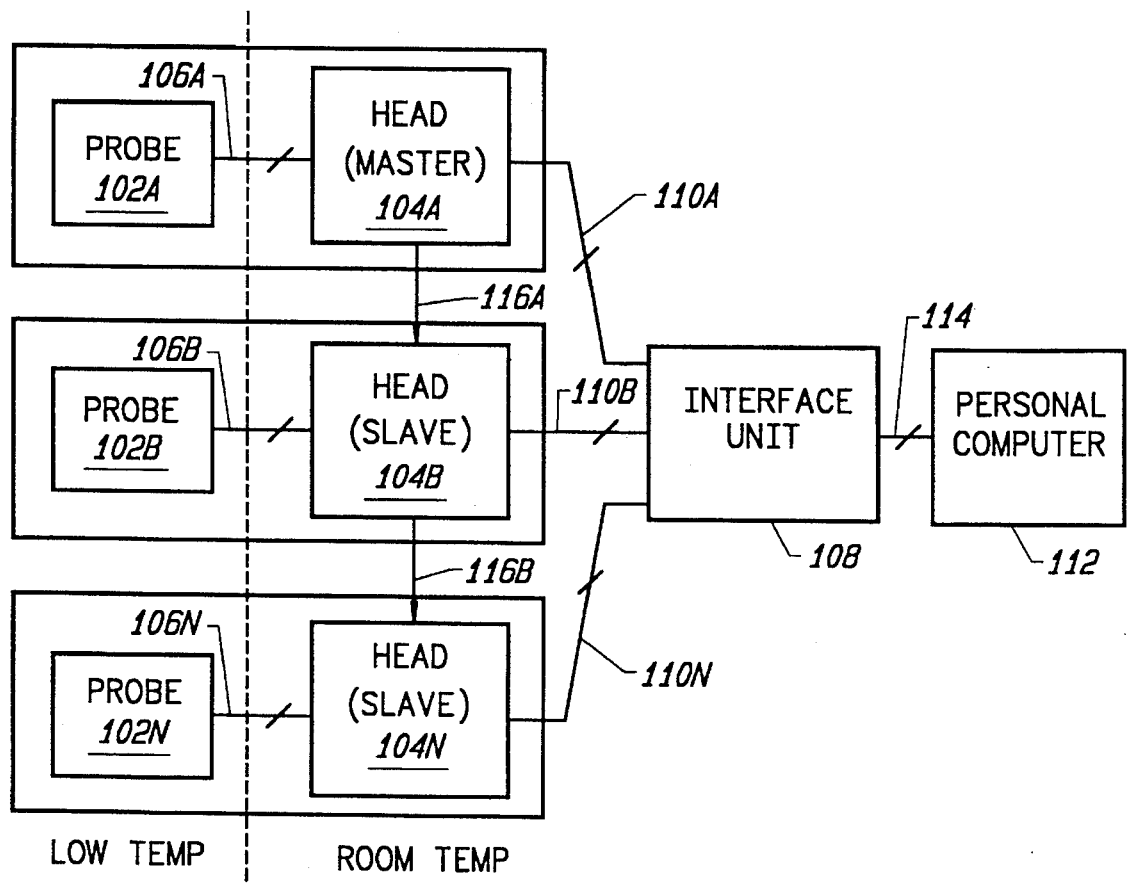
FIGS. 1, 8 and 9 depict overall topologies for SQUID systems according to the invention.

FIG. 1 depicts an overall topology for a SQUID system according to the invention. The system includes multiple channels, each including a probe 102a, 102b or 102n (collectively, 102) and a head unit 104a, 104b or 104n (collectively, 104). The probes 102 are adapted to be inserted into a cryostat, for example, with the head units 104 mounted on top of the cryostat. The mounting mechanism may be by adhesive, screw and nut, by the mechanical support of an electrical connector, or by any other technique. Respective cables 106a, 106b and 106n (collectively, 106) couple the probes 102 to their respective head units 104, either flexibly or through the hollow of a rigid tube. As with the APS and QD systems, the cables 106 are shielded and carry signals between the probe and the head unit via differential pairs. Appropriate precautions may also be used to minimize thermal conduction between the head units 104 and the cryogenic regions of the cryostat.

The head units 104 operate at room temperature. They are all coupled to a common interface unit 108 via a cable network which includes respective cables 110a, 110b and 110n (collectively, 110). As will be seen, these cables 110 need not be heavily shielded and may be of almost arbitrary length. As will further be seen, the cables 110 may also include optical fibers. The interface unit 108 is also connected to a computer such as personal computer 112 via an RS232 link 114. In another embodiment, the latter connection may follow a different protocol, such as GPIB.

As described in more detail below, the modulation frequencies of the various channels are synchronized by providing an RF oscillator in one of the head units 104a to act as a master. Each of the remaining head units 104b and 104n act as a slave to the immediately prior head unit, and as a master to the immediately subsequent head unit. Thus, the cable network includes a cable 116a coupling a master output of head unit 104a to a slave input of head unit 104b, and a cable 116b coupling a master output of head unit 104b to a slave input of head unit 104n. In another embodiment, instead of a daisy chain topology shown in FIG. 1, the master head unit might drive all of the slave head units directly. Other topologies will be apparent, some of which are described below. By synchronizing the modulation frequencies for all channels, beating is avoided.

Note that beating is avoided not only if the modulation frequencies for all channels are identical, but also if the modulation frequencies for different channels are multiples of each other. Beating is also avoided if the modulation frequencies for different channels are all multiples of a common frequency, as long as the common frequency is high enough to be easily filtered. As used herein, the term "synchronized" is intended to include all these variations.

Figure 2:
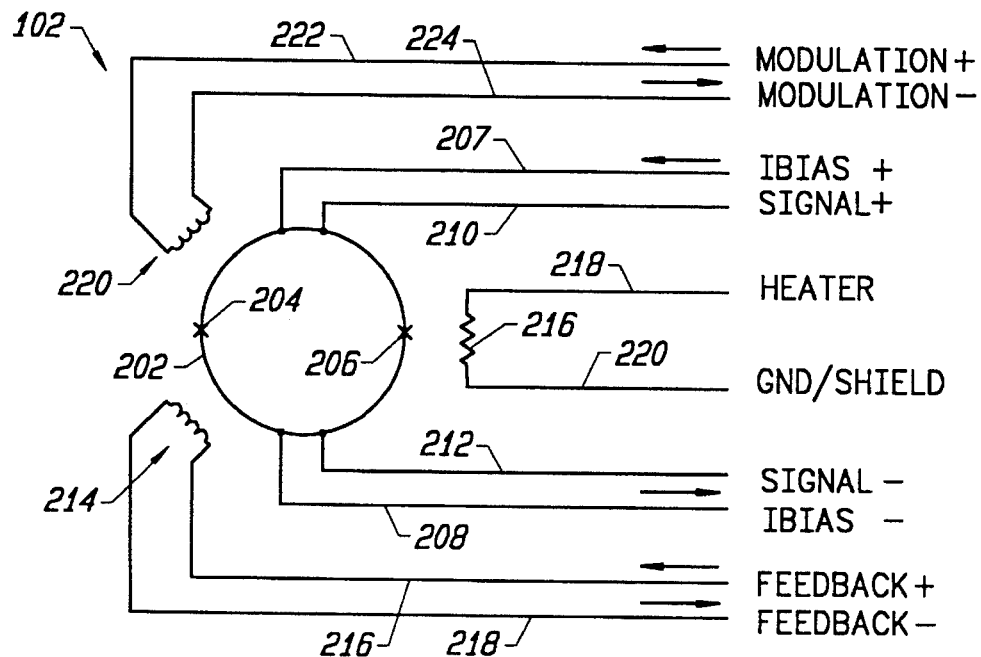
FIG. 2 symbolically depicts a SQUID probe.

FIG. 2 shows symbolically one of the SQUID probes 102 of FIG. 1. The particular structures on a SQUID probe chosen for use with the invention forms no part of the invention itself, the components of the SQUID control system implementing the invention being adapted to match the chosen SQUID probe type. However, the particular embodiment described herein is particularly suited for use with SQUID probes made of high temperature superconductors such as YBCO. An example of such a SQUID is described in Wellstood, et al., "Integrated dc SQUID Magnetometer with a High Slew Rate", Rev. Sci. Instrum., Vol. 55, No. 6, pp. 952–57 (1984), incorporated by reference herein.

As shown in FIG. 2, the probe includes a SQUID 202 having two Josephson junctions 204 and 206. The input bias current is provided to the SQUID over differential leads 207 and 208 (IBIAS+ and IBIAS−, respectively), and the voltage output from the SQUID is provided over differential leads 210, 212 (SIGNAL+ and SIGNAL−, respectively). A feedback coil 214 is included, which is driven differentially over FEEDBACK+ and FEEDBACK− lines 216 and 218, and in this example, a separate modulation coil 220 is included and driven over differential MODULATION+ and MODULATION− leads 222 and 224. Also, a small heater 216 is provided on the probe and driven by HEATER line 218 to the ground/shield line 220. The operation of the SQUID probe of FIG. 2 is conventional and is similar to that described above with respect to typical DC SQUID probes.

Figure 3:
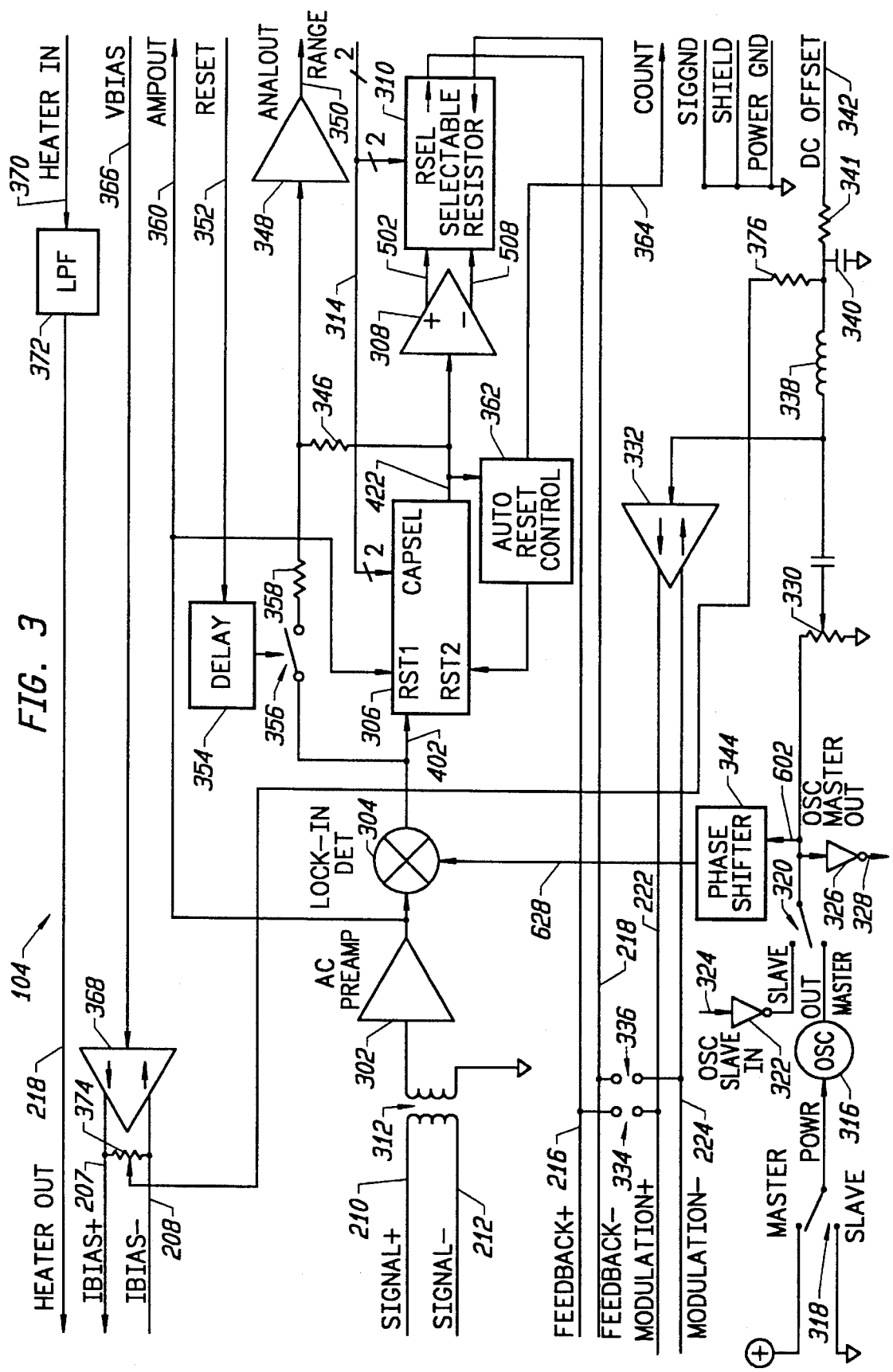
FIG. 3 is a block diagram of one of the head units of FIG. 1.

FIG. 3 is a block diagram of one of the head units 104 of FIG. 1. It is terminated on one side by a probe connector (not shown) for coupling to one of the probe units 102, and on the other side by an interface unit connector (not shown) for coupling via one of the cables 110 to the interface unit 108. The connector for coupling to one of the cables 110 may be, for example, a low-pass filter connector such as model 56-711-015, manufactured by Spectrum Control, Inc., Erie, Pa. The head units 102 are compact enough so that several may be mounted together on the top of a cryostat.

Referring to FIG. 3, flux locked loop feedback circuitry comprises a preamplifier 302, a lock-in detector 304, an integrator 306, a differential driver 308, and a differential current feedback path passing through selectable resistors 310. In particular, the differential voltage output of the SQUID probe arriving on lines 210 and 212 are coupled to opposite ends of the primary coil of a transformer 312. The secondary of the transformer 312 has one end connected to ground and the other end connected to the input of AC-coupled preamplifier 302. The preamplifier 302 is conventional and will not be described in detail herein, except to note that it amplifies the signal strength from a signal on the order of microvolts to a signal on the order of volts.

The output of the preamplifier 302 is connected to the signal input of lock-in detector 304. Lock-in detector 304 may be implemented using a double-balanced mixer such as an SRA-8 unit manufactured by Minicircuits, Inc., Brooklyn, N.Y. The output of lock-in detector 304 is connected to the signal input of integrator 306, which is described in more detail below. The integrator 306 has two reset inputs RST1 and RST2, activation of either of which will short-circuit the feedback capacitor.

The output of integrator 306 is connected to the input of differential driver 308, which includes a manual gain control potentiometer (not shown). The differential outputs of driver 308 are connected to one end of selectable resistor circuit 310. The differential outputs of selectable resistor 310 are connected to the differential feedback lines 216, 218 for coupling to the feedback coil of the SQUID probe. The head unit 104 receives a range control signal 314 from the interface unit 108 via the respective cable 110. The range control signal carries a two-bit binary value which is coupled to a resistor select (RSEL) input of the selectable resistor 310 in order to choose one of four feedback resistance values. The same range control signal 314 is also provided to a capacitor select (CAPSEL) input of integrator 306, which maintains a fixed integration time constant by selecting the appropriate one of four integration feedback capacitors.

Each of the head units 104 contains an internal square-wave oscillator 316 which may be switched in or out of service, depending on whether the particular head unit is acting as a master or slave. The power connection to oscillator 316 is therefore connected to the common of a single-pole, double-throw switch 318, one pole of which is connected to a power supply and the other pole which is connected to ground or left open. If the head unit 104 is acting as a master, the switch 318 is switched to supply power to the oscillator 316.

The output of oscillator 316 is connected to one pole of another single-pole, double-throw switch 320, the other pole of which is connected to the output of a buffer 322. The head unit 104 has a slave input lead 324 which is connected to the input of buffer 322.

The common of switch 320 is connected to the input of another buffer 326, the output of which is provided on a master output lead 328. The switch 320 is switched to the output of oscillator 316 if the head unit 104 is to be a master, and is switched to the output of buffer 322 if the head unit is to be a slave.

The common of switch 320 is also connected to one end of a variable resistor 330, the other end of which is connected to ground. The tap of variable resistor 330 is AC-coupled to the input of a differential driver 332, the differential current outputs of which drive the modulation current lines 222, 224 for provision to the modulation coil 220 of the SQUID probe. Jumpers 334 and 336 are provided for coupling the feedback current onto the differential modulation lines 222, 224, for use in the event that the feedback is to be applied to the SQUID via the modulation coil rather than via a separate feedback or input coil.

The input of differential current driver 332 is also DC coupled via an inductor 338, bypass capacitor 340 and series resistor 341 to a DC offset input line 342. The DC offset input line 342 is driven by interface unit 108 via the respective cable 110 as hereinafter described.

The common of the switch 320, in addition to being provided to the modulation lines 222 and 224, is also coupled via a phase shifter 344 to the local oscillator input of lock-in detector 304. Phase shifter 344 is inserted in order to compensate for phase shifting which occurs in the SQUID probe and head unit before the SQUID voltage signal is returned to the signal input of lock-in detector 304. A particularly advantageous structure for phase shifter 344 is described hereinafter with reference to FIG. 6.

The output of integrator 306, in addition to being provided to the input of differential current driver 308, is also coupled via a resistor 346 to a follower 348. The output of follower 348 forms an ANALOUT signal provided over a lead 350 for connection to the interface unit 108. The ANALOUT signal forms the analog output signal of the flux locked loop of the head unit 104, since it is proportional to the feedback current level. Another (preferred) way to read the analog output of the flux locked loop is to connect opposite ends of one side of the selectable resistor 310 to respective inverting and non-inverting inputs of an instrumentation amplifier (not shown), and provide the output of the instrumentation amplifier to the input of follower 348 via a resistor such as 346. In this manner, the voltage drop which the feedback current causes through one side of the selectable resistor 310 would be measured directly.

The RST1 input of integrator 306 is connected to a reset line 352, which is coupled via the respective cable 110 to receive a signal from the interface unit 108. The reset line 352 is also coupled via a delay 354 to the control input of an analog switch 356 which, when closed, couples the output of lock-in detector 304 via a resistor 358 to the input of follower 348. Thus, by applying a short pulse on reset line 352, the interface unit 108 can reset the integrator 306 remotely. If the reset signal is held asserted for a longer period of time, then not only is the integrator 306 held in a reset state, but the output of lock-in detector 304, instead of the voltage output of integrator 306, is coupled through to the ANALOUT line 350. This is a test mode which permits the interface unit 108 to observe the output of lock-in detector 304 directly. Additionally, the output of AC preamplifier 302 is also connected via an AMPOUT line 360 to the interface unit 108 via the respective cable 110 for direct observation. Optionally, in another embodiment, to avoid including this RF signal in the cable 110, the AMPOUT signal may be conducted separately to observation apparatus or omitted entirely.

The output of integrator 306 is also monitored by autoreset control circuitry 362 which, when the voltage output of integrator 306 exceeds a high threshold or falls below a low threshold, asserts a reset signal to the RST2 input of integrator 306. At the same time, autoreset control circuitry 362 sends a pulse to interface unit 108 via COUNT line 364 and the respective cable 110. The interface unit 108 keeps track of the number of resets asserted by the autoreset control circuitry 362, by observing the signals on COUNT line 364. Autoreset control circuitry 362 increases the dynamic range of the FLL by keeping the integrator 306 out of saturation. In a different embodiment, the same result can be achieved by omitting autoreset control circuitry 362, and having the interface unit 108 provide appropriate reset pulses over RESET line 352 in response to monitoring of the ANALOUT line 350.

The head unit 104 also receives a voltage signal over a VBIAS line 366 from the interface unit 108, indicating the bias current level desired for the SQUID 202. The VBIAS signal is connected to the input of a differential current driver 368, the differential outputs of which are connected to drive the IBIAS+ and IBIAS– lines 207 and 208. Similarly, the head unit 104 also receives a HEATERIN signal over a line 370 from the interface unit 108, indicating whether the heater 216 near the SQUID 202 should be turned on. The HEATERIN signal is coupled via a low-pass filter 372 to the HEATEROUT line 218 for provision to the SQUID probe 102.

The IBIAS+ line 207 is connected to one end of a variable resistor 374, the other end of which is connected to IBIAS– line 208. The tap of variable resistor 374 is coupled to the junction between inductor 338, resistor 341 and capacitor 340, via a series resistor 376. This connection permits implementation of an additional known low-frequency noise reduction scheme involving repeatedly reversing the bias current of the SQUID, and adjusting the DC bias flux of the SQUID synchronously therewith to maintain the operating point at a minimum or maximum of the voltage/flux curve. To use this scheme, software running in the interface unit 108 need only reverse the VBIAS signal repeatedly, at a frequency of 1–5 kHz, for example. The tap position of the variable resistor 374 is adjusted to obtain the appropriate movement of the operating point as the bias current reverses.

Figures 4, 5:
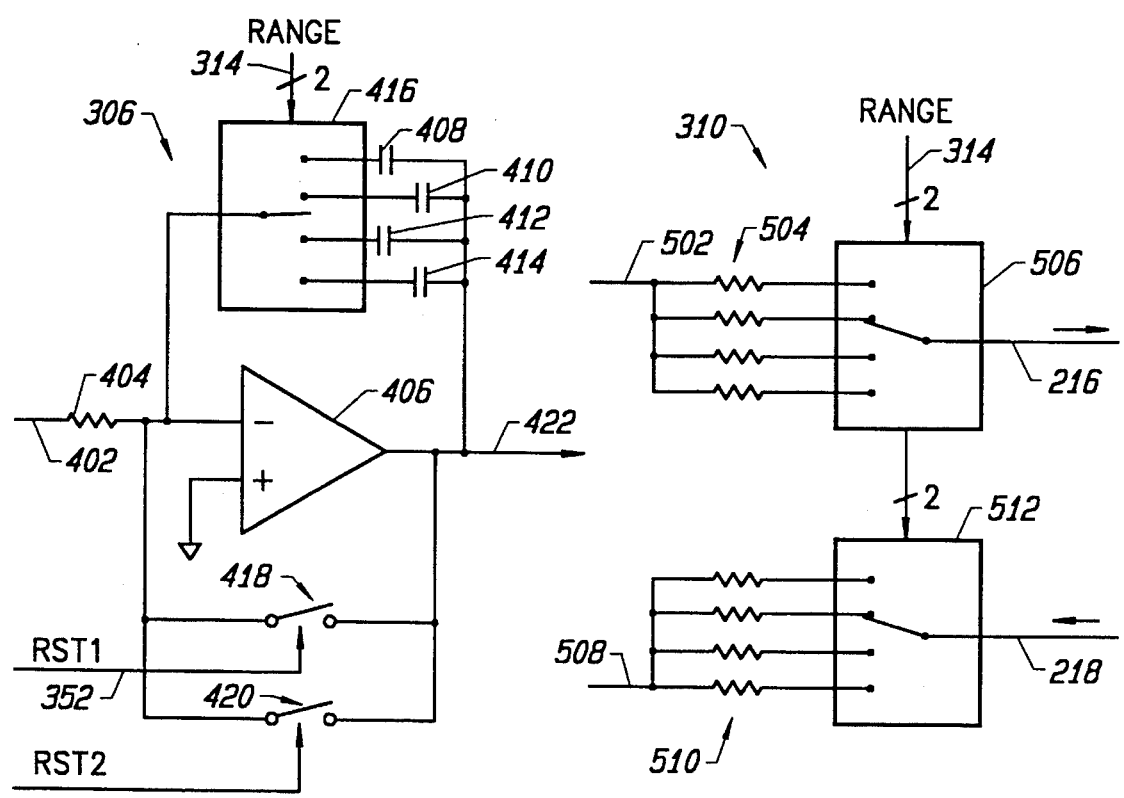
FIG. 4 is a schematic diagram of the integrator of FIG. 3.
FIG. 5 is a schematic diagram of the selectable resistor of FIG. 3.

FIG. 4 shows basic components of the integrator 306. The input line 402 is coupled via a series resistor 404 to the inverting input of an operational amplifier 406, the non-inverting input of which is connected to ground. The output of amplifier 406 is connected via four parallel paths through four different value capacitors 408, 410, 412 and 414, to respective poles of a single-pole, four-throw analog switch 416. The common of the analog switch 416 is connected back to the inverting input of amplifier 406, and the select input of analog switch 416 is connected to receive the two-bit RANGE signal over lines 314. The output of operational amplifier 406 is also connected back to the non-inverting input via two parallel single-pole, single-throw switches 418 and 420, the control inputs of which are connected to receive the RST1 and RST2 signals, respectively. When either of these signals is asserted, the respective switch 418 or 420 closes and shorts out whichever feedback capacitor 408, 410, 412 or 414 is currently in service. The output of operational amplifier 406 also forms the output 422 of the integrator 306.

FIG. 5 shows major components of selectable resistor 310 (FIG. 3). The non-inverting output 502 of driver 308 is coupled via four parallel resistors 504 to respective poles of a single-pole, four-throw switch, the select input port of which is coupled to receive the two-bit RANGE signal over lines 314. The inverting output 508 is similarly coupled via four parallel resistors 510 to respective poles of a single-pole, four-throw switch 512. The select input port of switch 512 is also coupled to receive the two-bit RANGE control signal over lines 314. The commons of switches 506 and 512 form the differential output lines 216, 218 of the selectable resistor 310.

As previously mentioned, it is desirable to shift the phase of the oscillator signal which is provided to the modulation lines 222 and 224, before it is provided as the local oscillator input to the lock-in detector 304 (FIG. 3). Phase shifters for sinewaves are well known, and one is described in Horowitz, "The Art of Electronics", second edition (Cambridge University Press: 1990), pp. 77–78. It is often desirable to phase shift a signal which is not a sinewave, however, and this is the case in the circuit of FIG. 3, in which the signal to be shifted is a square wave. Any signal which is not a sinewave contains Fourier components at different frequencies which, if applied to a conventional phase shifting circuit, would each shift by a different amount and result in a distorted output. Conventional phase shifters also do not permit the phase shift to be adjusted continuously over a large range.

In EG&G Brookdeal Electronics, Princeton Applied Research, "Model 128A Lock-In Amplifier—Operating and Service Manual", (Princeton, N.J.: 1971), p. VII-7, there is depicted a phase shifter circuit which is intended to phase shift signals having any frequency, and over a wide range. However, the circuit is exceedingly complicated.

Accordingly, the phase shifter 344 (FIG. 3) is constructed according to an aspect of the invention in which the input signal (from the oscillator 316 or from the buffer 322) is filtered to reduce or suppress all frequency components except a desired frequency component, such as the fundamental, and phase shifted by a desired amount to produce an intermediate signal. The intermediate signal is then shaped to generate an output signal having a desired shape in response to the intermediate signal. In particular, in FIG. 3, both the input signal to the phase shifter 344 and the desired shape of the output signal are square waves. Thus the phase shifter 344 includes a series resistor and a tuned circuit followed by a comparator. The tuned circuit is tuned to an adjustable frequency which is slightly above or below the fundamental frequency of the input square wave, and thus the resistor and tuned circuit will phase shift the selected signal by a desired positive or negative amount respectively. Specifically, tuning the tuned circuit above the selected signal frequency will produce a lag, and tuning the tuned circuit below the selected signal frequency will produce a lead. The phase shifter 344 then includes a comparator which produces a square wave in response to the intermediate signal.

Figure 6:
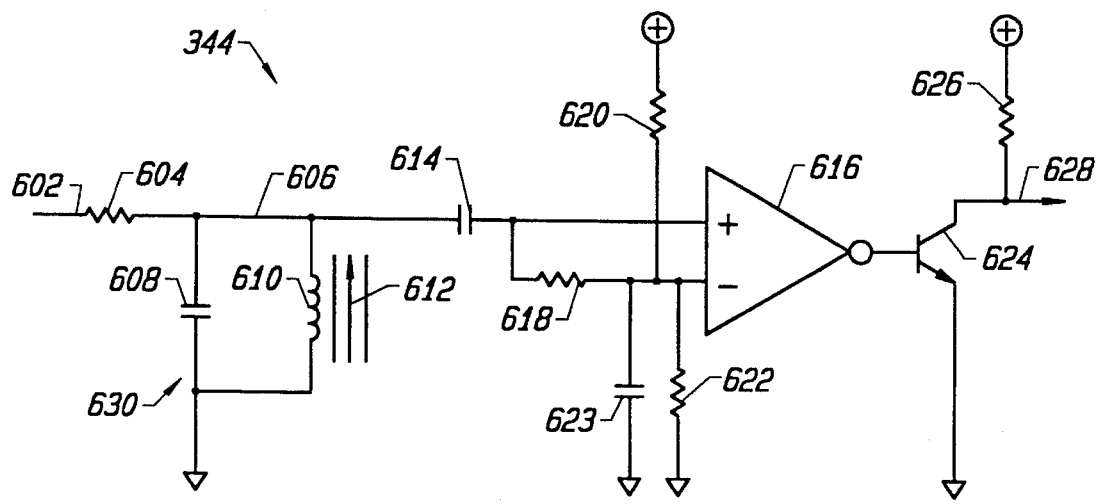
FIG. 6 is a schematic diagram of the phase shifter of FIG. 3.

FIG. 6 shows an embodiment of a phase shifter circuit according to this aspect of the invention. The input line 602 is coupled via a series resistor 604 to a node 606 which forms the top of a tuned circuit 630 coupled between node 606 and ground. The tuned circuit 630 comprises a capacitor 608 coupled between node 606 and ground, and a variable inductor 610 coupled in parallel with the capacitor 608. The inductor 610 is made variable by adjusting the insertion depth of a core 612 of the inductor 610.

The node 606, which carries the intermediate signal, is AC-coupled via a series capacitor 614 to the non-inverting input of a comparator 616. The non-inverting input of comparator 616 is also coupled to the inverting input of comparator 616 via a resistor 618, and the inverting input of comparator 616 is also connected to the output of a resistor divider formed by the series combination of a resistor 620 and a resistor 622 coupled between a positive voltage and ground. The inverting input of comparator 616 is also coupled to ground via a capacitor 623. The output of comparator 616 is connected to the base of a transistor 624 (which may actually be considered part of the comparator 616), the emitter of which is connected to ground and the collector of which is coupled via a resistor 626 to the positive supply. The collector of transistor 624 also forms the output 628 of the phase shifter 344.

In operation, capacitor 608 and inductor 610 are chosen such that the tuned circuit 630 effectively rejects (minimizes) all frequency components of the input signal other than the fundamental. Thus, the waveform at node 606 is essentially a sinewave having the same frequency as the input square wave. The phase is shifted relative to the phase of the input square wave, however, by a positive or negative amount which depends on the tuning frequency of the tuned circuit 630. The phase shifting is adjusted by adjusting the insertion depth of the core 612 of the inductor 610. Note that in a different embodiment, the tuning frequency of the tuned circuit 630 may be adjusted by any other known technique, such as by adjusting the effective number of turns of the inductor 610, or by adjusting the capacitance of capacitor 608.

The intermediate signal on node 606 is AC coupled to the non-inverting input of comparator 616, where it is compared with a threshold voltage defined primarily by the resistor divider formed by resistors 620 and 622. The bypass capacitor 623 prevents the intermediate signal from affecting the threshold voltage significantly. Together with the output transistor 624, the comparator 616 produces a low voltage level on output line 628 when the sinewave signal on the non-inverting input of comparator 616 is below the threshold and produces a high voltage level on the output 628 when the sinewave voltage on the non-inverting input of comparator 616 is above the threshold. Effectively, therefore, comparator 616 and transistor 624 convert the sinewave back to a square wave, the original shape of the input signal on line 602. Comparator 616 and transistor 624 may be purchased, for example, as part of a single LM311 integrated circuit manufactured by National Semiconductor Corp., Santa Clara, Calif.

A number of variations of the circuit of FIG. 6 are worthy of note. First, note that the squaring of the intermediate signal can be accomplished by other known means, instead of by a comparator 616. Second, note that the phase shifter 344 will work properly with any shape of input waveform, always producing an output waveform which is a square wave. Third, note that the tuned circuit 630 may be tuned near a harmonic of the input signal other than the fundamental, in which case the circuit of FIG. 6 will produce a phase-shifted square wave output at the frequency of the selected harmonic rather than the fundamental. Fourth, note that the squaring circuit which forms the output of the phase shifter may be replaced by another shaping circuit, to thereby provide the phase-shifted output signal with any desired shape (e.g. triangle or staircase).

Figure 7:
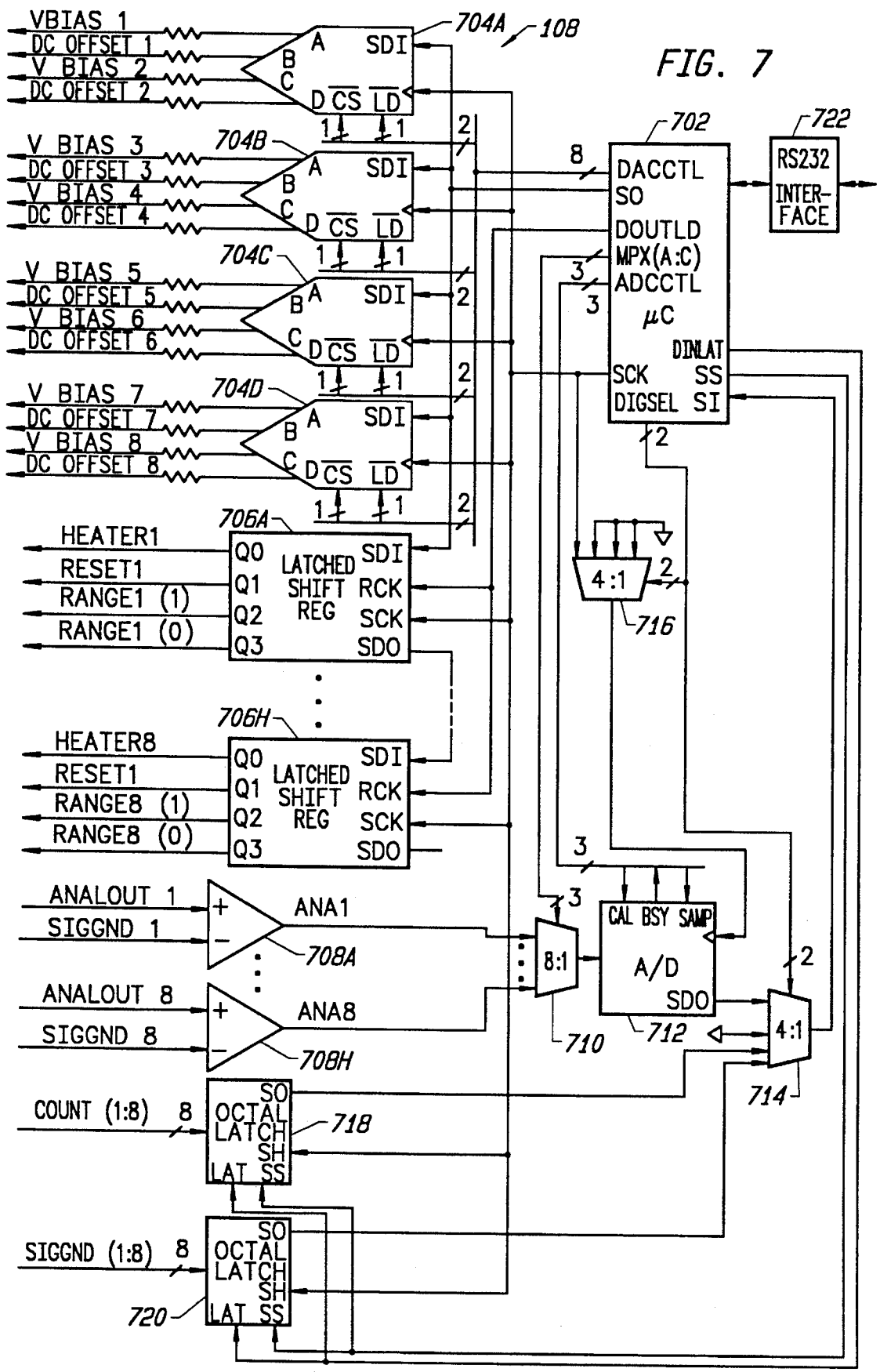
FIG. 7 is a block diagram of the interface unit of FIG. 1.

FIG. 7 is a block diagram of an interface unit 108 (FIG. 1). It comprises a microcomputer 702, which may be implemented using a 68HC805C4 chip manufactured by Motorola, Inc. The interface unit 108 also includes a bank of four quad 12-bit serial voltage-output DACs 704a, 704b, 704c and 704d (collectively, 704). Each of the quad DACs 704 may be a DAC-8420, manufactured by Analog Devices, Norward, Mass., and includes a serial data input (SDI), an active low chip select (CS) input, an active low load (LD) input, and a clock input. The SDI inputs of all of the quad DACs 704 are connected to receive a serial data signal from a serial output (SO) of the microcomputer 702, and the clock inputs for the DACs 704 are all connected to receive a serial clock signal from an SCK output of microcomputer 702. The microcomputer 702 also drives an 8-bit DACCTL output bus, carrying on individual lines the CS and LD signals for all four of the quad DACs 704. The quad DACs 704 each have four analog outputs A, B, C and D, one for each of the internal DACs, for a total of 16 analog outputs.

The operation of the quad DAC chips 704 is described in Analog Devices, "Quad 12-Bit Serial Voltage-Output DAC, Preliminary, DAC-8420", Datasheet (Norwood, Mass.: Jun. 23, 1992), incorporated by reference herein. Basically, each DAC within one of the chips 704 is addressed individually by a 16-bit serial word consisting of a 4-bit address header followed by a 12-bit data word. Of the four bits in the address header, the first two designate one of the four internal DACs and the last two are reserved. When the CS input of one of the chips 704 is asserted, data presented to the SDI input is loaded serially into an internal shift register, which shifts data in beginning with the first DAC address bit. In particular, data presented to the SDI input is shifted into the input register in response to each falling edge of SCK. Then, when LD is strobed, the 12-bit word in the input register is parallel-shifted out onto an internal data bus and written to the DAC data register for the DAC identified in the address bits. The DAC-8420 chips are chosen for the interface unit 108 because they are precise and compact, but it will be understood that other forms of DACs and other serial or parallel interface techniques may be used instead.

The A and B outputs of the quad DAC chip 704a are coupled via respective series resistors to provide the VBIAS1 and DCOFFSET1 signals which are coupled over one of the cables 110 to the first of up to eight heads 104 (FIG. 1). Similarly, the C and D outputs of quad DAC chip 704a are coupled via respective series resistors to provide VBIAS2 and DCOFFSET2 signals for the second head 104. The A and B outputs of the quad DAC chip 704b are coupled via respective series resistors to provide the VBIAS3 and DCOFFSET3 signals which are coupled over one of the cables 110 to a third head 104, and the C and D outputs of quad DAC chip 704b are coupled via respective series resistors to provide VBIAS4 and DCOFFSET4 signals for a fourth head 104. The A and B outputs of the quad DAC chip 704c are coupled via respective series resistors to provide the VBIAS5 and DCOFFSET5 signals which are coupled over one of the cables 110 to a fifth head 104, and the C and D outputs of quad DAC chip 704c are coupled via respective series resistors to provide VBIAS6 and DCOFFSET6 signals for a sixth head 104. The A and B outputs of the quad DAC chip 704d are coupled via respective series resistors to provide the VBIAS7 and DCOFFSET7 signals which are coupled over one of the cables 110 to a seventh head 104, and the C and D outputs of quad DAC chip 704d are coupled via respective series resistors to provide VBIAS8 and DCOFFSET8 signals for an eighth head 104.

The SO output of microcomputer 702 is also connected to a serial data input (SDI) of a latched shift register 706a. The latched shift register 706a may be, for example, a 74HC595 chip manufactured by Motorola, Inc. A separate latched shift register such as 706a is provided for each of the eight channels supported by the interface unit 108, the eighth of which is shown in FIG. 7 as 706h. Each of the latched shift registers 706a . . . 706h (collectively, 706) has a serial data output (SDO) lead which, except for latched shift register 706h, is connected to the SDI input of the next latched shift register in the chain. All the latched shift registers 706 also have a serial clock (SCK) input which is connected to receive the SCK output of microcomputer 702, and also have an RCK input which is coupled to receive a DOUTLD output of microcomputer 702. The latched shift registers 706 each store eight bits, only four of which are used in the interface unit 108. The exact designation of which bits carry which control signals is not important, but illustratively, one of the bits in a latched shift register 706 corresponding to one of the channels carries the HEATER signal, one of the bits carries the RESET signal, and two of the bits carry the RANGE signal. These bits are provided from Q0–Q3 outputs of the latched shift register, over one of the cables 110, to the head unit 104 corresponding to that channel.

The latched shift registers 706 operate by serially shifting in the data from the SDI input, and simultaneously serially shifting out data from the shift register to the SDO output, in response to each pulse of the SCK input. Only when the RCK signal is strobed are the then-current contents of the shift register latched to the output pins. Accordingly, to modify any of the outputs of any of the latched shift registers 706, the microcomputer 702 strobes a serial stream of 8×8=64 bits through the eight latched shift registers, using the SO and SCK outputs of microcomputer 702. It then strobes the DOUTLD output of microcomputer 702 in order to latch all 64 bits to the outputs of latched shift registers 706. The microcomputer 702 maintains a copy of the full set of bits internally, in case not all the outputs are to be changed.

The ANALOUT signals 350 (FIG. 3) from each of the heads 104 are provided over respective cables 110 to the non-inverting inputs of respective difference amplifiers 708a ... 708h (collectively, 708). The inverting inputs of the amplifiers 708 are coupled to receive the signal ground (SIGGND) from the respective heads 104 via the cables 110. The outputs of the amplifiers 708, designated ANA1 ... ANA8 in FIG. 7, are coupled to respective inputs of an 8:1 analog multiplexer 710, the three-bit select input port of which is coupled to receive a three-bit MPX(A:C) signal from microcomputer 702. The output of multiplexer 710 is connected to the analog input of an A/D converter 712. The A/D converter 712, may be, for example, an AD677 manufactured by Analog Devices, Norwood, Mass. Three control leads of the A/D converter 712 (CAL, BSY and SAMP) are coupled to respective lines of an ADCCTL bus of the microcomputer 702. The A/D converter 712 provides a 16-bit digital output, and does so serially through a serial data output (SDO) pin. The SDO pin is connected to one input of 4:1 digital multiplexer 714, the output of which is connected to a serial input (SI) of the microcomputer 702. The two-bit select input port of multiplexer 714 is coupled to receive a two-bit DIGSEL output signal from microcomputer 702, which is also provided to the select input of another multiplexer 716. The SCK output of microcomputer 702 is connected to one of the inputs of multiplexer 716, the other three inputs being grounded. The input to which the SCK signal is connected is the same input as that to which the SDO output of A/D converter 712 is connected on multiplexer 714, so that when DIGSEL signal causes multiplexer 714 to select the SDO signal from A/D converter 712, it also causes multiplexer 716 to select the SCK signal from microcomputer 702. The output of multiplexer 716 is connected to the clock input of A/D converter 712 which is used both to control the conversion and also to clock digital data out the SDO output.

The COUNT output of each of the heads 104 is coupled via a respective cable 110 to a respective input of an octal latch 718. Similarly, the SIGGND connection of each of the heads 104 is coupled via the respective cable 110 to a respective input of an octal latch 720. The octal latches 718 and 720, which may be 74HC597s manufactured by Motorola, Inc., include a serial output (SO) for shifting out the latched data serially. The SO outputs of latches 718 and 720 are coupled to respective inputs of multiplexer 714. It is useful to be able to read the SIGGND leads of the head units 104 since it permits the microcomputer 702 to determine whether a head unit is connected to each of the eight channels. Note that pullup resistors (not shown) are connected to the SIGGND inputs of interface unit 108 to provide a logic 1 if one of the inputs is not grounded by a head.

Each of the octal latches 718 and 720 has a latch (LAT) input, both of which are coupled to receive a DINLAT signal from microcomputer 702, and an SS input, which is coupled to receive an SS output signal from microcomputer 702. Each of the octal latches also includes an SH input which is coupled to receive the SCK output of microcomputer 702. The octal latches 718 operate by latching an eight-bit parallel input value in response to a pulse on the LAT input, and shifting the latched data out the respective SO pin in response to a series of pulses applied to the SH input. The SS input allows serial shifting to SO when high, or parallel loading when low. Accordingly, the microcomputer 702 can read the current values of the COUNT signals from the eight head units 104 by first strobing the DINLAT output of microcomputer 702, setting the DIGSEL output of microcomputer 702 such that multiplexer 714 selects the SO output of octal latch 718 for provision to the SI input of microcomputer 702, and then strobing the SCK output of microcomputer 702 a sufficient number of times to shift out the eight bits which were latched into latch 718 in response to the strobing of DINLAT. The microcomputer 702 can perform a similar operation to read the eight SIGGND signals from the heads 104.

The interface unit 108 further includes an RS232 interface 722 for coupling the microcomputer 702 to an external unit such as a computer (such as a personal computer) or dumb terminal. The RS232 interface 722 may utilize the MAX250/MAX251 chipset manufactured by Maxim Integrated Products, Sunnyvale, Calif. Additional isolation may be achieved using optoisolators.

It should be noted that individual signal lines connected to microcomputer 702 are individually named in FIG. 7. Many of these lines actually connect to the general purpose I/O ports of the microcomputer 702, and are merely controlled by software running in the microcomputer 702 to perform the individual functions described herein. In particular, Table I sets forth each of the designations and their corresponding port pins. In this table, "!" signifies an active low signal.

TABLE I

| 68HC805C4 Port Pin | FIG. 7 Designation |
| --- | --- |
| PA0 | DIGSELA |
| PA1 | DIGSELB |
| PA2 | SS |
| PB0 | DACA!CS |
| PB1 | DACA!LD |
| PB2 | DACB!CS |
| PB3 | DACB!LD |
| PB4 | DACC!CS |
| PB5 | DACC!LD |
| PB6 | DACD!CS |
| PB7 | DACD!LD |
| PC0 | ADCSAMP |
| PC1 | ADCBUSY |
| PC2 | ADCCAL |
| PC3 | MPXA |
| PC4 | MPXB |
| PC5 | MPXC |
| PC6 | DOUTLD |
| PC7 | DINLAT |
| PD2/MISO | SI |
| PD3/MOSI | SO |
| PD4/SCK | SCK |

The circuitry of FIG. 7 is one example of apparatus which may be included in the interface unit 108 (FIG. 1) to control the individual channels of the multiple SQUID system, and to read the channel outputs of the multiple SQUID system. The interface unit 108 can, however, take numerous other forms instead.

The interface unit 108 in the present embodiment does not itself have any controls of its own. Rather, it is adapted to receive commands and transmit data over an RS232 cable 114 to a personal computer 112. The computer 112 issues high-level commands over the cable 114 to the interface unit 108, preferably in the form of ASCII characters, and receives data, preferably also in the form of ASCII characters. The interface unit 108 provides the low-level control signals over the cables 110 in response to the commands received from the RS232 port 114, and returns data to the computer 112 over the RS232 port 114 in response to the analog output signals received over the cables 110 from the individual channels. The ASCII communications protocol with the personal computer 112 is preferred since it permits the personal computer 112 to be replaced, in certain applications, with merely a dumb terminal.

The software running in microcomputer 702 (FIG. 7) parses commands received over the RS232 interface 722, and converts the operands to binary numbers. It responds with an error message if an illegal instruction is received. Once a valid command is received, the microcomputer 702 alters the setting of the output devices appropriately in accordance with the command. For example, one of the commands ("Gc") causes the interface unit 108 to read the output signal from a selected SQUID channel using A/D converter 712, convert the reading to decimal via a software routine, and then transmit it through the RS232 port. Another command ("Icnnnn") instructs the interface unit 108 to perform these actions automatically with a specified repetition rate. This the microcomputer 702 accomplishes substantially simultaneously with the interpretation and execution of other commands.

The software in microcomputer 702 also includes some built-in test features, enabling various parts of the system to be tested. Included among these is the option to have the interface unit 108 transmit a predefined fixed data sequence through the RS232 interface 722.

Table II is a list of the commands which can be provided over the RS232 cable 114 into the interface unit 108. In this Table, "c" represents a channel number (1 to 8, 0 representing all channels), "nnnn" represents 1–4 ASCII decimal digits, which may be preceded by a "+" or "−"; and "±" represents either a plus or a minus.

TABLE II

COMMANDS

| | |
|---|---|
| Bcnnnn | Set bias current. Valid range is −2048 to +2047. Reset gives zero current. |
| Dcnnnn | Set DC bias flux. Range as above. |
| Rc | Reset the SQUID. The reset pulse lasts 0.1 sec, or slightly longer if conversions continue during the reset. |
| Tc± | Turn on (+) or off (−) SQUID test mode. |
| Hc± | Turn on (+) or off (−) SQUID heater. |
| Icnnnn | Set interval between readings to nnnn hundred microseconds and commence readings. If nnnn=0, cease repetitive readings. The maximum interval is 0.9999s. |
| Gc | Get a single reading. Repetitive readings are turned off if they are presently on. |
| V | Return the firmware version number. In debug mode, returns other information. |
| Mnnnn | Set operating mode. The mode number is determined by adding the values of the mode switches:<br>Debug mode    128 and higher<br>Test data mode    64<br>The normal, default mode is mode 0. |
| XJR | Reset the interface unit (not the SQUID, but the SQUID will become unlocked because all bias control lines will be set to zero). |

Each command must be terminated with a carriage return character in order to have the command executed. Linefeed characters are ignored, and the escape character cancels a partially transmitted command. SQUID output data are returned in the form of an optional ±, followed by five ASCII decimal digits, for a total range of −32768 to +32767.

In test data mode (M64), the microcomputer 702 transmits data from an internal table of test data rather than from the A/D converter 712. The test data set is 128 readings long, and repeats continuously. In the debug mode, the interface unit 108 responds to the V command as follows:

| | |
|---|---|
| mode 128 | A test string is transmitted over RS232 cable 114 repetitively until a character is received back over the RS232 cable 114. |
| mode 129 | A longer version message is transmitted. |
| mode 130 | Interface unit 108 transmits the system variables in binary. |

All modes below 128, and any one of the modes of 128 or above, may be activated simultaneously by adding their mode numbers. Note also that if the interface unit 108 is caused to take data more quickly than the rate at which it can be transmitted over the RS232 cable 114, then interface unit 108 will omit data values from the stream so that the transmitted data are always the most recent.

Figure 8:
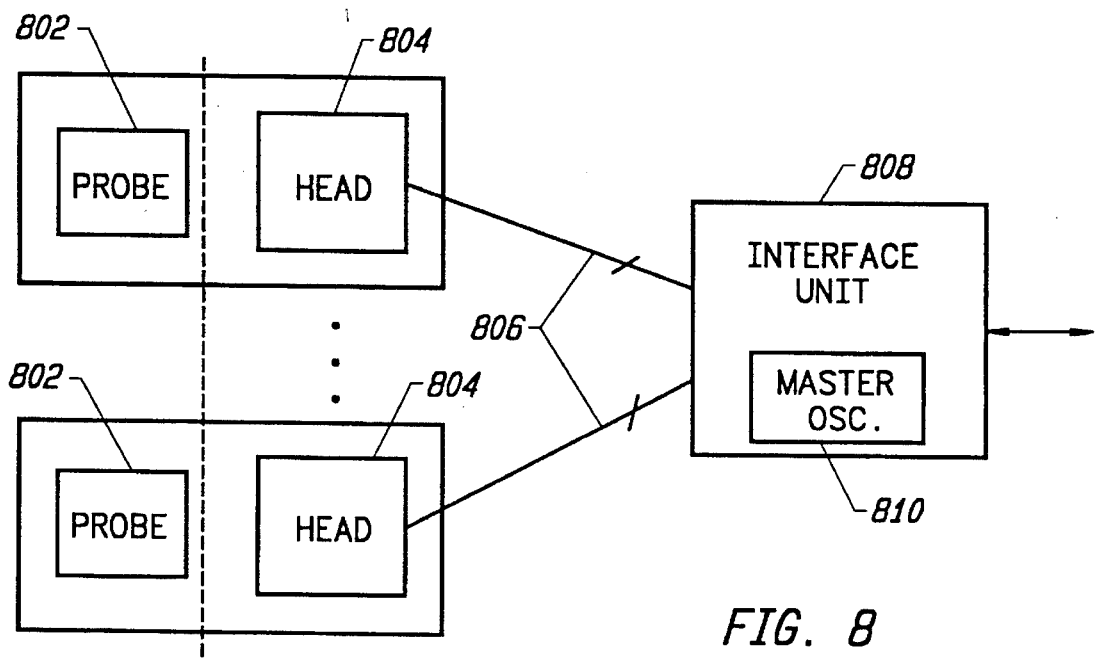

FIG. 8 is an alternative topology for a system for controlling multiple SQUID channels. As with the topology of FIG. 1, each channel comprises a cryogenic probe 802, a corresponding room temperature head unit 804 containing the FLL feedback circuitry, coupled via a respective cable 806 to a common interface unit 808. In order to avoid daisy chaining the oscillator signal, however, the modulation frequencies for the various channels are all controlled by a master oscillator 810 in the interface unit 808. The modulation frequency is transmitted over the cables 806 to all of the head units 804.

One problem with the topology of FIG. 8 arises because the modulation signal must be conveyed by a high-bandwidth path which, unlike other signals in the cable 806, cannot be heavily filtered. As previously described, noise from the digital circuitry in the interface unit 808 could couple into the modulation frequency signal and thus be transmitted to the head units 804. In order to avoid this, the modulation frequency signal may be optically isolated in each of the heads 804, or may be transmitted to the heads 804 via an optical fiber running in the cables 806. Alternatively, the modulation frequency may be transmitted through the cable 806 with a divided-down frequency, and regenerated to the proper frequency in the head units 804 through the use of phase locked loops.

Figure 9:
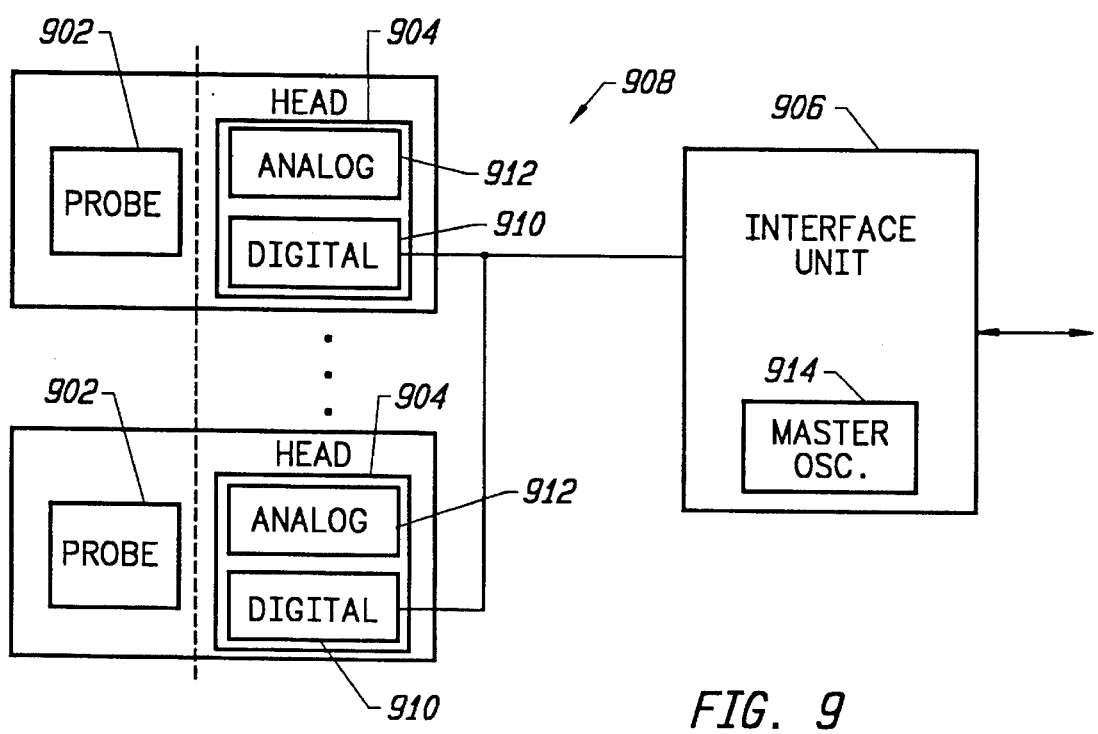

FIG. 9 shows yet another topology for a multiple-channel SQUID control system. Again, as with the topology of FIG. 1, each channel comprises a cryogenic probe 902 and a room temperature head unit 904. The heads 904 are all connected to an interface unit 906 via a cable network 908, but the cable network 908 comprises only a single cable connection to interface unit 906 and is daisy chained or parallel-bussed from one head unit 904 to the next. The cable network 908 carries digital streams of information, which are read and/or driven by an intelligent digital portion 910 of each of the heads 904. Each of the heads 904 contain this digital portion 910 as well as an analog portion 912 similar to that in the topologies of FIGS. 1 and 8. The head units 904 are still small enough to reside at the top of the cryostat, and the digital portions 910 are themselves intelligent enough to interpret instructions and transmit data over the cable network 908.

The cable network 908 may be either copper wire or optical fiber, for example. In this topology, a master oscillator 914 is included in the interface unit and provides the basic bus data rate for the transmission of data over the cable network 908. With appropriate encoding of the data transmitted (such as that used for Manchester encoding), the signal always contains a strong frequency component which corresponds to the bit rate. This bit rate is recovered by phase locked loops in the heads 904 at the same time the commands are received. Thus the cable network 908 serves the function of transmitting the synchronized modulation frequency at the same time that it transmits commands.

The invention has been described with respect to particular embodiments thereof, and numerous modifications can be made within its scope. For example, various other low-frequency noise reduction schemes can be implemented in addition to feedback current modulation and an AC bias current. As another example, many of the principles described herein may be extended for use with RF SQUIDs. These modifications and others are intended to be within the scope of the claims.

I claim:

1. SQUID control apparatus, for use with a SQUID probe having a voltage output, comprising:

a head unit having electrical conductors to receive said voltage output of said probe, said head unit having, in conjunction with said probe, a non-cryogenic flux-locked loop having an analog output indicative of the magnetic flux applied externally to said probe;

a base unit having means for converting said analog output to a digital signal; and cable means for carrying said analog output from said head unit to said base unit, said cable means distancing said base unit from said head unit.

2. Apparatus according to claim 1, further comprising a cryostat which maintains said probe at cryogenic temperatures, said head unit being mounted on said cryostat.

3. Apparatus according to claim 1, for use with a plurality of SQUID probes, wherein said head unit is one of a plurality of head units, each having, in conjunction with a respective one of said probes, a flux-locked loop having a respective analog output indicative of the magnetic flux applied externally to said respective probe, wherein said base unit has means for converting the analog outputs of all of said head units to digital signals, and wherein said cable means carries the analog output of all of said head units to said base unit.

4. Apparatus according to claim 1, wherein said SQUID probe comprises a SQUID loop, means for obtaining said voltage output from said SQUID loop, and a feedback coil for applying a feedback magnetic flux to said SQUID loop, and wherein said flux-locked loop comprises:

means for applying a compensating feedback current level to said feedback coil in response to a deviation of said voltage output of said probe from a quiescent value; and means for providing said analog output of said flux-locked loop in response to said compensating feedback current level.

5. Apparatus according to claim 4, wherein said means for applying a compensating feedback current level comprises:

means for integrating said deviation of said voltage output of said probe from said quiescent value, to produce an integrated value; and means for applying said compensating feedback current level in response to said integrated value.

6. Apparatus according to claim 4, wherein said head unit has modulation means for cooperating with structures in said probe to apply modulating flux oscillations to said probe, wherein said quiescent value of said voltage output of said probe constitutes a quiescent value of the magnitude of oscillations in said voltage output of said probe, and wherein said means for applying a compensating feedback current level comprises:

means for demodulating said voltage output of said probe, to produce a demodulated value; and means for applying said compensating feedback current level in response to said demodulated value.

7. Apparatus according to claim 6, wherein said modulation means comprises an RF oscillator having an oscillating output signal and means for outputting an oscillating current to said probe in response to said oscillating output signal, and wherein said means for demodulating comprises a phase shifter having an output and an input coupled to receive said oscillating output signal, said means for demodulating further comprising a lock-in detector having a first input coupled to receive said voltage output of said probe and a second input coupled to said output of said phase shifter, said lock-in detector producing said demodulated value.

8. Apparatus according to claim 6, wherein said modulation means comprises:

an internal oscillator having an output;

an external oscillator input lead; and means for outputting an oscillating current to said probe in response to selectably said output of said internal oscillator or said external oscillator input lead.

9. A non-cryogenic head unit for a SQUID control system, for use with a base unit and with a SQUID probe, said base unit providing remote control signals for said head unit, said SQUID probe having a SQUID, a feedback coil and leads for applying a bias current to said SQUID, for providing a voltage output from said SQUID, and for applying a feedback current to said feedback coil, said head unit comprising:

a flux-locked loop feedback circuit having an input lead for receiving said voltage output from said SQUID, a feedback output lead for providing said feedback current to said feedback coil of said probe, and an analog output indicating the magnitude of said feedback current;

means for receiving said remote control signals from said base unit and applying them to said head unit; and means for disposing said head unit in close proximity to said probe relative to said base unit.

10. A head unit according to claim 9, further comprising:

an internal oscillator having an output;

a lead for receiving an external oscillator signal;

means for selecting said output of said internal oscillator or said external oscillator signal, to provide a selected oscillator signal; and means for applying said selected oscillator signal to said probe to modulate the flux applied to said SQUID, said flux-locked loop feedback circuit further having a demodulator for demodulating said voltage output from said SQUID in response to an oscillator input coupled to respond to said selected oscillator signal.

11. A head unit according to claim 10, for use with a SQUID probe which further has a modulation coil distinct from said feedback coil and a lead for applying a modulation current to said modulation coil, wherein said means for applying comprises:

a modulation output lead for providing said modulation current to said modulation coil of a probe; and means for coupling said selected oscillator signal selectably to said feedback output lead or to said modulation output lead.

12. A head unit according to claim 10, further comprising a phase shifter coupled to phase shift said selected oscillator signal for provision to said oscillator input of said demodulator, said phase shifter comprising:

shifting filter means for filtering said selected oscillator signal to reduce all frequency components except a fundamental frequency component, and for shifting said fundamental frequency component by a desired amount, to produce an intermediate signal; and shaping means for generating a square wave in response to said intermediate signal.

13. A head unit according to claim 9, wherein said flux-locked loop feedback circuit further has a range selection input port, and wherein said means for receiving remote controls from said base unit comprises means for receiving a range selection signal from said base unit and applying said range selection signal to said range selection input port of said flux-locked loop feedback circuit.

14. A head unit according to claim 9, wherein said means for receiving remote controls from said base unit comprises means for receiving a bias determination signal from said base unit, said head unit further comprising:

a bias output lead for providing said bias current to said probe; and means for applying said bias current to said bias output lead in response to said bias determination signal.

15. A head unit according to claim 9, wherein said leads of said SQUID probe include a first lead for receiving a DC offset current for application as a DC offset flux to said SQUID, wherein said means for receiving remote controls from said base unit comprises means for receiving a DC offset determination signal from said base unit, said head unit further comprising means for applying said DC offset current to said first lead of said SQUID probe in response to said DC offset determination signal.

16. A head unit according to claim 9, wherein said means for receiving remote controls comprises a cable coupling said head unit to said base unit.

17. A head unit according to claim 9, further comprising a cryostat for maintaining said probe at cryogenic temperatures, wherein said means for disposing said head unit in close proximity to said probe relative to said base unit comprises:

an attaching mechanism attaching said head unit to said cryostat; and a cable coupling said head unit to said base unit.

18. A non-cryogenic head unit for a SQUID control system, for use with a base unit and with a SQUID probe, said SQUID probe having a SQUID, a feedback coil and leads for applying a bias current to said SQUID, for providing a voltage output from said SQUID, for applying a feedback current to said feedback coil, and for receiving a DC offset current for application as a DC offset flux to said SQUID, said head unit comprising:

an internal oscillator having an output;

a lead for receiving an external oscillator signal;

means for selecting said output of said internal oscillator or said external oscillator signal, to provide a selected oscillator signal;

a phase shifter coupled to phase shift said selected oscillator signal to provide a phase shifted oscillator signal;

a flux-locked loop feedback circuit having an input lead for receiving said voltage output from said SQUID, a feedback output lead for providing said feedback current to said feedback coil of said probe, and an analog output indicating the magnitude of said feedback current, said flux-locked loop feedback circuit further having a range selection input port;

means for applying said selected oscillator signal to said probe to modulate the flux applied to said SQUID, said flux-locked loop feedback circuit further having a demodulator for demodulating said voltage output from said SQUID in response to an oscillator input coupled to receive said phase shifted oscillator signal; and means for receiving a range selection signal from said base unit and applying said range selection signal to said range selection input port of said flux-locked loop feedback circuit, said head unit further comprising means for receiving a bias determination signal from said base unit;

a bias output lead for providing said bias current to said probe; and means for applying said bias current to said bias output lead in response to said bias determination signal, said head unit further comprising means for receiving a DC offset determination signal from said base unit;

means for applying said DC offset current in response to said DC offset determination signal to said lead of said SQUID probe for receiving a DC offset current; and means for disposing said head unit in close proximity to said probe relative to said base unit.

19. SQUID control apparatus, for use with a plurality of SQUID probes, comprising:

a plurality of head units, including a master head unit, each of said head units corresponding to a respective one of said SQUID probes, each of said head units including a non-cryogenic modulated flux-locked loop feedback circuit operating at a respective modulation frequency; and a base unit coupled to all of said head units, said base unit providing control signals for controlling said head units, wherein said master head unit generates a modulation frequency signal, and wherein the modulation frequency of all of said modulated flux-locked loop feedback circuits is synchronized in response to said modulation frequency signal.

20. SQUID control apparatus, for use with a plurality of SQUID probes, comprising:

a plurality of head units, including a master head unit, each of said head units corresponding to a respective one of said SQUID probes, each of said head units including a non-cryogenic modulated flux-locked loop feedback circuit operating at a respective modulation frequency, wherein said master head unit generates a modulation frequency signal;

a base unit coupled to all of said head units, said base unit providing control signals for controlling said head units; and synchronizing means for synchronizing the modulation frequency of all of said modulated flux-locked loop feedback circuits in response to said modulation frequency signal.

21. Apparatus according to claim 20, wherein said synchronizing means comprises:

a master modulation oscillator having an output coupled to all of said head units; and deriving means in each of said head units for deriving the modulation frequency of the respective head unit from said output of said master modulation oscillator.

22. Apparatus according to claim 21, wherein said master modulation oscillator is disposed in one of said head units, said output of said master modulation oscillator being coupled to all others of said head units by daisy chain.

23. SQUID control apparatus, for use with a plurality of SQUID probes, comprising:

a plurality of head units, including a master head unit, each of said head units corresponding to a respective one of said SQUID probes, each of said head units including a non-cryogenic modulated flux-locked loop feedback circuit operating at a respective modulation frequency, wherein said master head unit generates a modulation frequency signal;

a base unit coupled to all of said head units, said base unit providing control signals for controlling said head units; and synchronizing means for synchronizing the modulation frequency of all of said modulated flux-locked loop feedback circuits in response to said modulation frequency signal, wherein said synchronizing means comprises:

a master modulation oscillator having an output coupled to all of said head units, deriving means in each of said head units for deriving the modulation frequency of the respective head unit from said output of said master modulation oscillator, wherein said master modulation oscillator is disposed in said base unit, said base unit further comprising means for transmitting said control signals to said head units in a form including the transmission of a digital bit stream carrying at least some of said control signals and operating at a frequency responsive to said output of said master modulation oscillator, said deriving means in each of said head units including means for deriving the modulation frequency of said respective head unit from said digital bit stream.

24. SQUID control apparatus, for use with a plurality of SQUID probes, comprising a master head unit corresponding to one of said probes and a slave head unit corresponding to each of the others of said probes, said master head unit comprising:

a master modulated flux-locked loop feedback circuit operating at a master modulation frequency;

a master modulation oscillator coupled to provide said master modulation frequency to said master modulated flux-locked loop feedback circuit; and a slave output coupled to carry said master modulation frequency from said master modulation oscillator, each of said slave head units comprising:

a slave modulated flux-locked loop feedback circuit operating at a slave modulation frequency; and a master input coupled to provide said slave modulation frequency to said slave modulated flux-locked loop feedback circuit, said SQUID control apparatus further comprising a cable network coupling said slave output of said master head unit to said master input of a first one of said slave head units so that said master head unit controls said slave head units.

25. Apparatus according to claim 24, wherein each of said slave head units further comprises a slave output coupled to carry the slave modulation frequency from the master input of said respective head unit, and wherein said cable network couples the master input of each of said slave head units to receive the slave output of a previous one of said head units in a chain, all of said slave modulation frequencies being derived ultimately from said slave output of said master head unit.

26. SQUID control apparatus according to claim 24, wherein each of said head units forms an analog output signal indicative of the magnetic flux applied externally to the corresponding SQUID probe, said control apparatus further comprising a base unit and a cable network coupling said base unit to each of said head units, said base unit receiving said analog output signals from said head units over said cable network and providing control signals over said cable network for controlling said head units.

* * * * *